(12) United States Patent
Kubo et al.

(10) Patent No.: US 7,645,665 B2
(45) Date of Patent: Jan. 12, 2010

(54) SEMICONDUCTOR DEVICE HAVING SHALLOW B-DOPED REGION AND ITS MANUFACTURE

(75) Inventors: Tomohiro Kubo, Kawasaki (JP); Kenichi Okabe, Kawasaki (JP); Tomonari Yamamoto, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 246 days.

(21) Appl. No.: 11/607,927

(22) Filed: Dec. 4, 2006

(65) Prior Publication Data
US 2007/0232039 A1  Oct. 4, 2007

(30) Foreign Application Priority Data
Mar. 30, 2006  (JP) .............................. 2006-094702

(51) Int. Cl.
*H01L 21/8238* (2006.01)

(52) U.S. Cl. .................. 438/232; 438/199; 438/217; 438/218; 438/229; 438/230; 438/231; 438/275; 438/276; 438/289; 438/290; 438/291; 438/299; 438/301; 438/306; 438/307; 438/542; 438/545; 438/546

(58) Field of Classification Search .................. 438/199, 438/217, 218, 229–232, 275–276, 289–291, 438/299, 301, 306–307, 542, 545–546
See application file for complete search history.

(56) References Cited

U.S. PATENT DOCUMENTS 6,989,322 B2 * 1/2006 Gluschenkov et al. ...... 438/585
2002/0031883 A1 * 3/2002 Sayama ........................ 438/231
2004/0004250 A1 * 1/2004 Momiyama et al. ......... 257/336
2004/0253790 A1 * 12/2004 Ootsuka ....................... 438/305
2004/0259302 A1 * 12/2004 Ito et al. ....................... 438/231
2005/0127449 A1 * 6/2005 Momiyama ................. 257/369
2006/0008964 A1 * 1/2006 Mineji ......................... 438/199
2006/0063321 A1 * 3/2006 Sasaki ......................... 438/199
2007/0072382 A1   3/2007 Yamamoto et al.

FOREIGN PATENT DOCUMENTS

| JP | 2004-235603 A | 8/2004 |
| JP | 2005-136382 A | 5/2005 |
| JP | 2005-142344 A | 6/2005 |

\* cited by examiner

*Primary Examiner*—Kevin M Picardat
*Assistant Examiner*—Bac H Au
(74) *Attorney, Agent, or Firm*—Westerman, Hattori, Daniels & Adrian, LLP (57) ABSTRACT

A method for manufacturing a semiconductor device has the steps of: (a) implanting boron (B) ions into a semiconductor substrate; (b) implanting fluorine (F) or nitrogen (N) ions into the semiconductor device; (c) after the steps (a) and (b) are performed, executing first annealing with a heating time of 100 msec or shorter relative to a region of the semiconductor substrate into which ions were implanted; and (d) after the step (c) is performed, executing second annealing with a heating time longer than the heating time of the first annealing, relative to the region of the semiconductor substrate into which ions were implanted. The method for manufacturing a semiconductor device is provided which can dope boron (B) shallowly and at a high concentration.

7 Claims, 12 Drawing Sheets

| SAMPLE | F IMPLANTATION | msec ANL | JUNCTION DEPTH @ 1E18cm⁻³ [nm] | IMPURITY STEEPNESS [nm/decay] | B CONCENTRATION AT DEPTH OF 10nm [cm⁻³] | B CONCENTRATION AT KINK [cm⁻³] | REGION WHERE B CONCENTRATION IS 1E20 OR HIGHER [nm] |
|---|---|---|---|---|---|---|---|
| S10 | NO | NO | 29.9 | 8.3 | 8.3E19 | 1.0E20 | 7.3 |
| S11 | NO | YES | 31.4 | 8.0 | 9.5E19 | 1.2E20 | 9.1 |
| S12 | YES | NO | 26.2 | 8.0 | 1.2E20 | 1.5E20 | 11.8 |
| S13 | YES | YES | 26.2 | 6.3 | 1.8E20 | 2.4E20 | 15.0 |

| SAMPLE | N IMPLANTATION | msec ANL | JUNCTION DEPTH @ 1E18cm⁻³ [nm] | IMPURITY STEEPNESS [nm/decay] | B CONCENTRATION AT DEPTH OF 10nm [cm⁻³] | B CONCENTRATION AT KINK [cm⁻³] | REGION WHERE B CONCENTRATION IS 1E20 OR HIGHER [nm] |
|---|---|---|---|---|---|---|---|
| S20 | NO | NO | 29.9 | 8.3 | 8.3E19 | 1.0E20 | 7.3 |
| S21 | NO | YES | 31.4 | 8.0 | 9.5E19 | 1.2E20 | 9.1 |
| S22 | YES | NO | 25.6 | 6.7 | 1.2E20 | 1.5E20 | 11.5 |
| S23 | YES | YES | 25.0 | 5.4 | 1.7E20 | 2.0E20 | 13.7 |

# SEMICONDUCTOR DEVICE HAVING SHALLOW B-DOPED REGION AND ITS MANUFACTURE

CROSS REFERENCE TO RELATED APPLICATION

This application is based on and claims priority of Japanese Patent Application No. 2006-094702 filed on Mar. 30, 2006, the entire contents of which are incorporated herein by reference.

BACKGROUND OF THE INVENTION

A) Field of the Invention

The present invention relates to a method for manufacturing a semiconductor device and a semiconductor device, and more particularly to a method for manufacturing a semiconductor device capable of doping boron (B) shallowly and at a high concentration and a semiconductor device manufactured by this method.

B) Description of the Related Art

As transistors are miniaturized and become microfine, it becomes necessary to make shallow a junction depth of source/drain regions in order to suppress the short channel effects. Extension regions having a shallow junction depth are formed on both sides of the gate electrode, sandwiching the channel region, and deep source/drain regions are formed at positions spaced from the gate electrode. As a gate electrode length becomes short, an effective gate length becomes shorter than an actual gate length, and a phenomenon of a lowered threshold value occurs.

In order to ensure a desired threshold value and form shallow and low resistance extension regions, pocket (halo) regions are formed surrounding the extension regions, impurities (dopant) of a conductivity type opposite to that of the extension regions being doped in the pocket regions. Ion implantation for forming the pocket regions is performed along a plurality of directions, e.g., along the directions tilted by about 30° from a substrate normal direction.

Ion implantation is used for adding dopant. Implanted dopant is initially electrically non-active, and damages are formed in ion implanted semiconductor. In order to activate dopant and restore (recrystallize) the damaged semiconductor, annealing such as rapid thermal annealing (RTA) using a halogen lamp is performed.

It is essential to reduce parasitic resistance of the extension regions of source/drain regions in order to realize a miniaturized and high performance transistor. To this end, it is required to form extension regions which are shallow and have low resistance and a steep dopant profile. High temperature annealing is necessary for activating dopant highly efficiently. In order to realize a steep dopant profile, it is necessary to suppress dopant diffusion.

It is desired to perform annealing which has a high arrival or reach temperature to realize highly efficient activation of dopant and has a short high temperature stay time to suppress dopant diffusion. From this reason, spike annealing has been used which is RTA having a very short highest temperature stay time. Spike annealing can realize 0 second of the highest temperature Tmax stay time. However, a stay time at a temperature 50° C. lower than the peak temperature Tmax (Tmax−50° C.) or above is about 1 to 2 sec, so that thermal diffusion of dopant occurs.

If a shallow junction is to be formed by suppressing diffusion of dopant, it is necessary to lower an annealing temperature. However, a dopant activation factor lowers and a sheet resistance increases. As the annealing temperature is raised to increase the activation factor, dopant is diffused and the junction becomes deep. As described above, it is difficult for conventional spike annealing to form a shallow and low resistance diffusion layer required by miniaturized transistors. Further, spike annealing is accompanied by diffusion of increased speed (abnormal diffusion) at the initial annealing stage ascribed to damages formed during ion implantation, which makes it more difficult to form a shallow junction.

JP-A-2004-235603 proposes to dope one of diffusion suppressing substances N, Ar, F and C, most preferably N, during impurity ion implantation for pocket regions, in order to make a steep dopant concentration profile. Indium (In) is doped in an n-channel transistor to form p-type pocket regions. In order to form n-type pocket regions in a p-channel transistor, for example, antimony (Sb) is doped. For ion implantation for pocket regions, the diffusion suppressing substance N is doped. After ion implantation for extension regions and deep source/drain regions, spike annealing of almost 0 sec is performed. Since N is doped, leak current reduces. It is reported that a profile of the diffusion suppressing substance after annealing shows a peak at both positions at the surface and an interface between amorphous (A) and crystal (C) (A/C interface).

JP-A-2005-136382 proposes optical pulse annealing using an Xe flash lamp, instead of rapid thermal annealing (RTA) using a halogen lamp. An Xe flash lamp can irradiate an optical energy of 5 $J/cm^2$ to 100 $J/cm^2$ in about 0.1 msec to several hundred msec, and can raise a temperature to 900° C. to 1400° C. An Xe flash lamp can raise a temperature from 450° C. to 1300° C. in about 3 msec, and from 900° C. to 1300° C. in about 1 msec. This proposal reports that a dopant activation rate or factor is insufficient at a temperature lower than 900° C. and dopant diffusion becomes remarkable at a temperature higher than 1400° C. Annealing with an annealing time of a msec order is called msec annealing.

In this proposal, a dummy gate is formed and extensions and deep source/drain regions are formed, and thereafter the dummy gate is removed and channel doping is executed to provide the function similar to that of pocket regions. The proposal reports that although In doped by the channel doping was able to be activated only by about 20% by RTA with halogen lamp, In was able to be activated by about 80% by msec annealing using a flash lamp. This proposal also teaches that since msec annealing after the last channel doping activates impurities in the other regions, RTA may be performed at 500° C. to 900° C. after preceding ion implantation for the extensions and source/drain regions to suppress diffusion to 5 nm or less and recrystallize damaged semiconductor, instead of performing msec annealing each time dopant is implanted.

JP-A-2005-142344 indicates that it is necessary to activate impurities after ion implantation and recrystallize an amorphousized layer, and teaches to combine flash lamp annealing (FLA) not diffusing impurities and reducing crystal defects and FLA activating impurities, and perform this combined annealing after impurity ions are implanted. For example, first FLA is executed at a preheating of 400° C. and a radiation energy density of 24 $J/cm^2$, and second FLA is executed at a preheating of 450° C. and a radiation energy density of 28 $J/cm^2$. This publication also teaches that RTA may be executed in place of first FLA and that if ion implantation is to be executed a plurality of times, although FLA activating impurities is executed after the last impurity implantation, the FLA may be omitted after the preceding impurity implantation processes.

There is also a proposal of msec annealing using laser in place of an Xe flash lamp. Ultratech Inc., CA., U.S.A. sells a msec annealing system LSA100 using continuous wave (CW) laser. The specification describes that a temperature can be raised or lowered in a psec order to in a msec order by scanning the surface of a silicon substrate with a laser beam.

With the advent of such flash lamp annealing and laser annealing, msec annealing technologies have been provided which can raise a temperature higher than 1200 to 1300° C. in a ultra short time of about 1 msec. As a heating time is shortened, diffusion of dopant can be suppressed, and as an arrival or reach temperature is raised, a dopant activation rate or factor can be improved.

SUMMARY OF THE INVENTION

An object of this invention is to provide a method for manufacturing a semiconductor device capable of doping boron (B) shallowly and at a high concentration, and a semiconductor device manufactured by this method.

Another object of this invention is to provide a method for manufacturing a semiconductor device including a novel process of annealing implanted impurity ions.

According to one aspect of the present invention, there is provided a method for manufacturing a semiconductor device, comprising the steps of:

(a) implanting boron (B) ions into a semiconductor substrate;

(b) implanting fluorine (F) or nitrogen (N) ions into the semiconductor device;

(c) after the steps (a) and (b) are performed, executing first annealing with a heating time of 100 msec or shorter relative to a region of the semiconductor substrate into which ions were implanted; and (d) after the step (c) is performed, executing second annealing with a heating time longer the heating time of said first annealing, relative to the region of the semiconductor substrate into which ions were implanted.

According to another aspect of the present invention, there is provided a semiconductor device comprising:

a semiconductor substrate; and a p-type region formed on the semiconductor substrate and containing boron (B) and fluorine (F) or nitrogen (N), wherein a B concentration rapidly lowers from a surface of the semiconductor substrate as a depth becomes deeper, then gradually lowers forming a kink, and a B concentration at a depth of the kink is $2\times10^{20}$ cm$^{-3}$ or higher.

According to still another aspect of the present invention, there is provided a method for manufacturing a semiconductor device comprising steps of:

(a) implanting impurity ions into a semiconductor substrate;

(b) after the step (a) is performed, executing first annealing with a heating time of 100 msec or shorter relative to a region of the semiconductor substrate into which ions were implanted; and (c) after the step (b) is performed, executing second annealing with a heating time longer than the heating time of the first annealing, relative to the region of the semiconductor substrate into which ions were implanted, before other annealing processes are executed.

There are provided a method for manufacturing a semiconductor device having a shallow junction plane and a low resistance p-type region and such a semiconductor device.

A B doped p-type region can be formed shallowly and at a high concentration.

There is provided a method for manufacturing a semiconductor device including a novel annealing process for ion implanted regions.

DESCRIPTION OF THE PREFERRED EMBODIMENTS

First, experiments made by the present inventors will be described.

Figure 1:
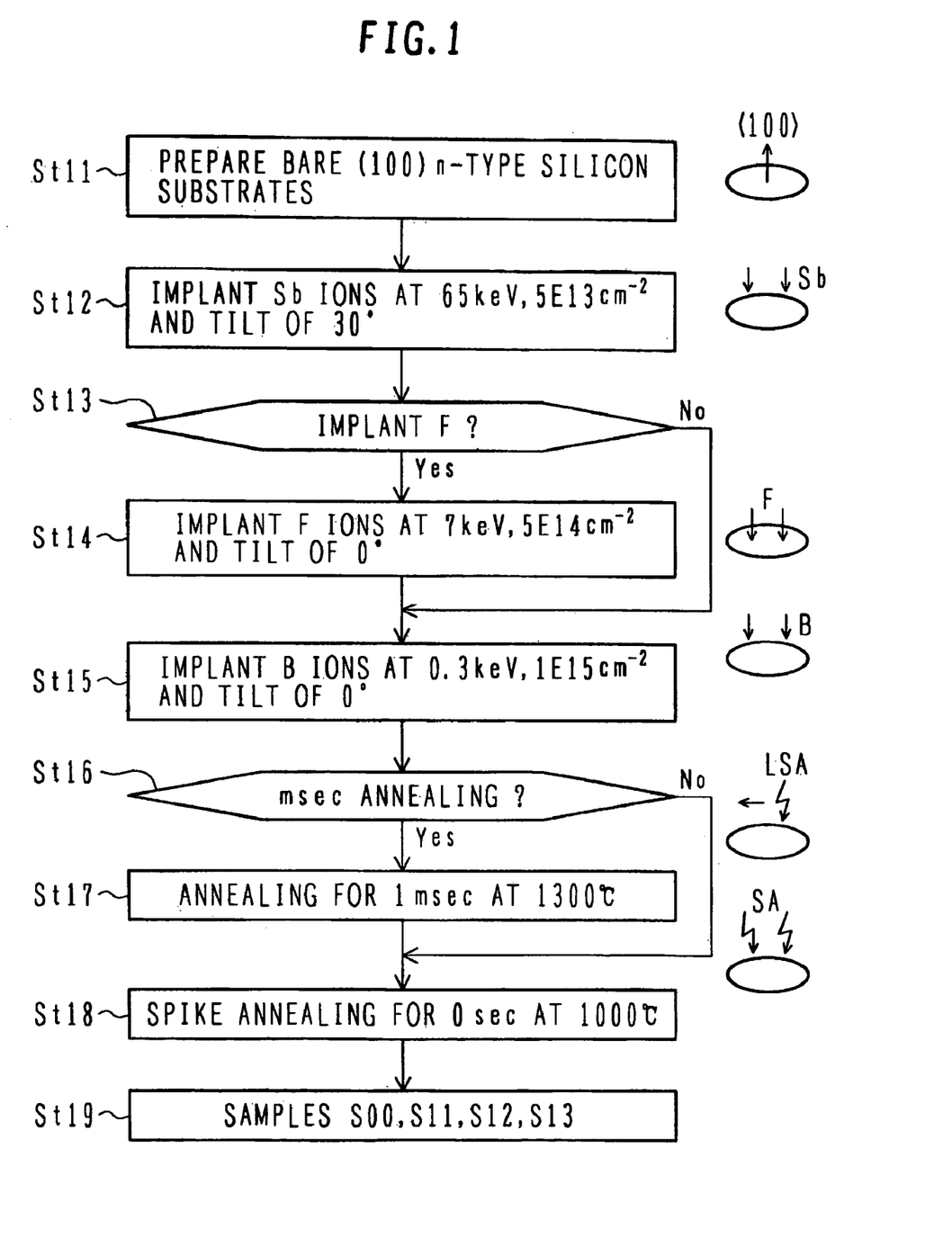
FIG. 1 is a flow chart illustrating the procedure of a first experiment.

FIG. 1 is a flow chart illustrating the procedure of a first experiment. At Step St11, bare n-type (100) Si substrates are prepared. At Step St12, antimony (Sb) ions are implanted at an acceleration energy of 65 keV, a dose of $5\times10^{13}$ cm$^{-2}$ (this expression is replaced with a simple form in some cases, such as 5E13 for $5\times10^{13}$) and a tilt angle of about 30° from a substrate normal direction (along symmetrical four directions).

At Step St13, samples are grouped into samples with fluorine (F) ion implantation and samples without F ion implantation. A difference can be checked between the characteristics of the samples with F ion implantation and the characteristics of the samples without F ion implantation. At Step St14, F ions are implanted into the samples with F ion implantation at an acceleration energy of 7 keV, a dose of 5E14 cm$^{-2}$ and a tilt angle of 0°. The samples without F ion implantation pass this Step. At Step St15, boron (B) ions are implanted into all samples at an acceleration energy of 0.3 keV, a dose of 1E15 cm$^{-2}$ and a tilt angle of 0°.

At Step St16, the samples are grouped into samples with msec annealing and samples without msec annealing. With and without F ion implantation and msec annealing, four types of samples are formed. The msec annealing was performed by using a laser annealing system LSA100 manufactured by Ultratech Inc., CA, U.S.A. At Step St17, msec annealing is performed for 1 msec at 1300° C. in the laser annealing system LSA100. After the msec annealing, spike annealing SA is performed at Step St18 for 0 second at 1000° C. In this manner, samples of four types were formed including a sample S10 without F implantation and msec annealing, a sample S11 without F implantation and with msec annealing, a sample S12 with F implantation and without msec annealing, and a sample S13 with F implantation and msec annealing.

Figure 2A:
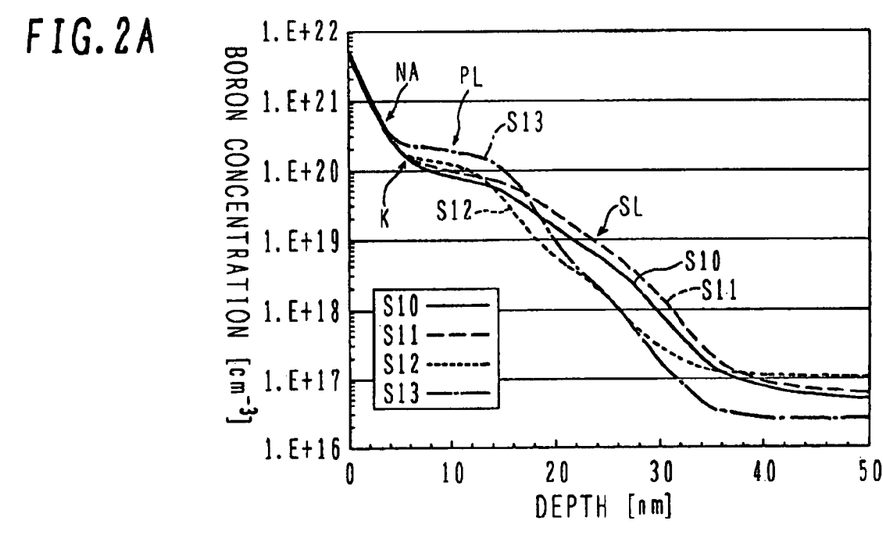
FIGS. 2A and 2B are a graph and a table showing B concentration profiles obtained by SIMS measurements of the first experiment.

B concentration profiles along a depth direction of these samples of four types were measured by secondary ion mass spectroscopy (SIMS).

FIG. 2A is a graph showing measurement results. The abscissa represents a depth from a substrate surface in the unit of nm, and the ordinate represents a boron (B) concentration in the unit of $cm^{-3}$. Description will be made by using as a reference the sample S10 without F implantation and msec annealing. A B concentration of the sample S10 steeply lowers down to a depth of about 5 nm. Since B in this region is electrically non-active, this region is called an non-active region NA. It is said that B is in a cluster state. The curve bends at a kink K under the non-active region NA, and forms a plateau PL gradually lowering the B concentration in a region from 5 to 15 nm in depth, and then a sloped portion SL increasing a reduction speed as the depth becomes deeper.

A B concentration of the sample S11 with msec annealing increases slightly in the plateau PL and also increases in the sloped portion SL. Assuming that a junction plane is formed at a B concentration of about $1E18 cm^{-2}$, it can be said that the junction depth becomes deeper.

A B concentration of the sample S12 with F implantation increases further at the first half of the plateau PL, and thereafter increases a reduction speed, forming a two-step sloped portion. The sloped portion SL locates very near to the surface. It can be said that the junction depth becomes shallow. The B concentration profile of the sample S12 is much different from those of the samples S10 and S11.

A B concentration of the sample S13 with F implantation and msec annealing increases further in the plateau PL, maintains high concentration in a broader region, and steeply transits to the one-step sloped portion SL, and has a profile at a depth of about 22 nm or deeper approximately coincident with that of the sample S12. Since the B concentration in the plateau increases in a broader range, the resistance becomes low. Since the sloped portion becomes near to the surface, it can be said that the junction depth becomes shallow.

Since B in the non-active region NA is considered not to contribute to conductivity, a resistance of the B doped region is considered to depend mainly on the concentration and depth range of the plateau PL. A B concentration in the plateau is represented typically by the concentration at the kink K. Even if a dose of B ion implantation is increased, the B concentration at the kink after the spike annealing does not increase. Only the B concentration in the non-active region NA after the spike annealing is increased.

Figure 2B:
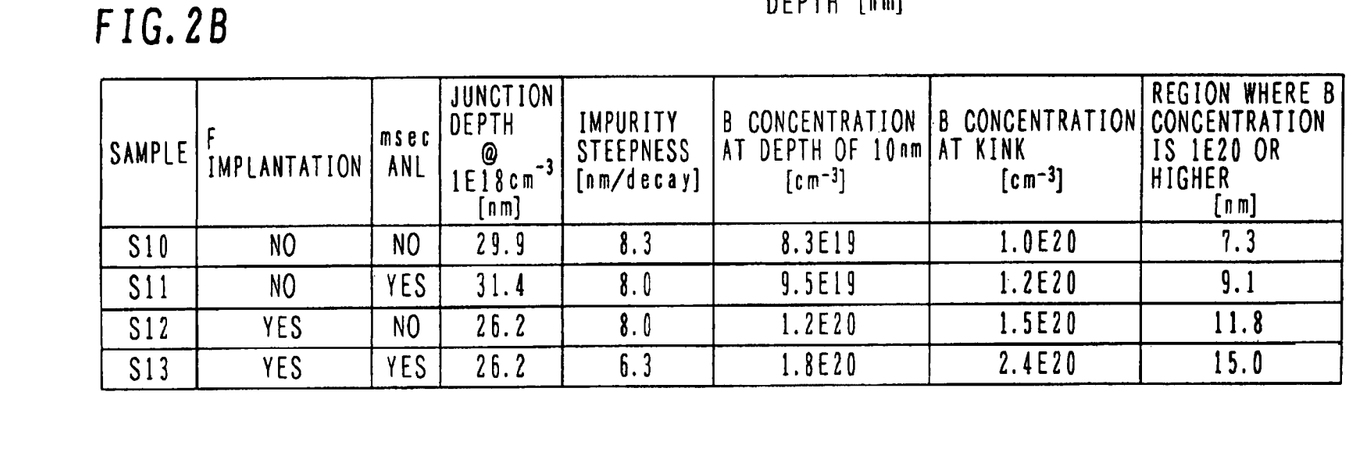

FIG. 2B is a table formed by extracting characteristic features of the graph shown in FIG. 2A. The features of the B concentration profile are represented by: a junction depth at a concentration of $1E18 cm^{-3}$; impurity steepness (the smaller the value, the steeper) measured by a depth difference between a concentration $1E19 cm^{-3}$ and a one-digit smaller concentration $1E18 cm^{-3}$; a B concentration at a depth of 10 nm; a B concentration at the kink; and a depth of a region where a B concentration is $1E20 cm^{-3}$ or higher. A resistance of the B doped region is dominated by a B concentration at the kink and a depth range of the plateau. However, a boundary of the depth range of the plateau is difficult to define. Instead of the depth range of the plateau, the depth of the region including the non-active region NA where the B concentration is $1E20 cm^{-3}$ or higher is used, which is easy to define objectively.

A B concentration of the reference sample S10 at the kink is $1.0E20 cm^{-3}$, and a depth where the B concentration is $1E20 cm^{-3}$ or higher is 7.3 nm. A B concentration of the sample S11 with only msec annealing at the kink is $1.2E20 cm^{-3}$, and a depth where the B concentration is $1E20 cm^{-3}$ or higher is 9.1 nm. Both the profiles are similar and the B concentration in the region outside the non-active region NA increases. It is therefore expected that the resistance in the B doped region lowers. However, the junction depth becomes deeper.

A B concentration of the sample S12 with only F implantation at the kink increases greatly to $1.5E20 cm^{-3}$, and a depth where the B concentration is $1E20 cm^{-3}$ or higher is 11.8 nm which is positioned in the sloped portion. It is not possible to simply compare the sample S12 with the samples S10 and S11 whose B concentration lowers to $1E20 cm^{-3}$ in the plateau. It is clear that the junction depth becomes shallow.

The sample S13 with both F implantation and msec annealing has a shallow junction depth similar to that of the sample S12, and the impurity distribution is steepest. A B concentration at the kink governing the resistance is as high as $2.4E20 cm^{-3}$ not obtained heretofore, and a depth range of the plateau is broadened. A depth where the B concentration is $1E20 cm^{-3}$ or higher becomes deeper to 15.0 nm. This depth corresponds to the sloped portions of the other samples, and it is expected that the resistance lowers considerably. With the method for manufacturing the sample S13, it becomes possible to realize a B concentration of $2.0E20 cm^{-3}$ or higher at the kink, not obtained heretofore.

Figure 3:
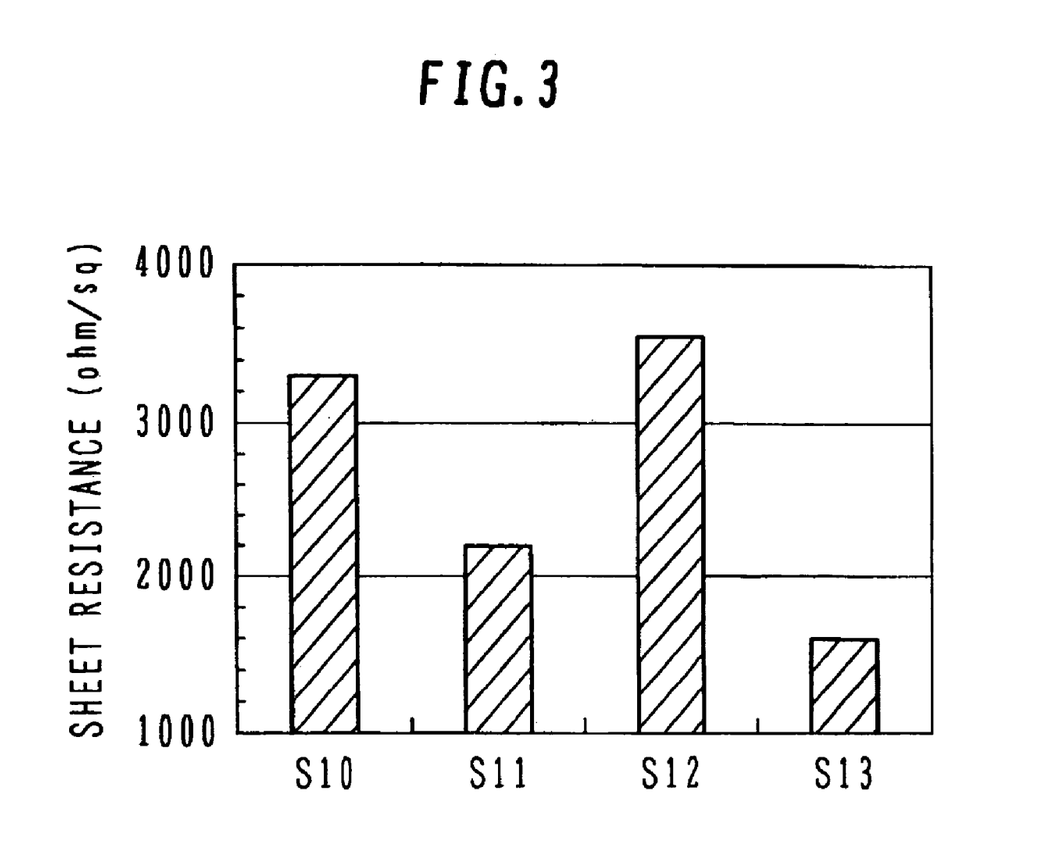
FIG. 3 is a graph showing sheet resistances of B doped regions obtained by the first experiment.

FIG. 3 is a bar graph showing measurement results of sheet resistances of four types of the samples. A sheet resistance of the sample S12 with only F doping increases more than that of the reference sample S10 without F doping and msec annealing. This may be ascribed to a narrow depth range of the plateau. A sheet resistance of the sample S11 with only msec annealing lowers to about two thirds of the sheet resistance of the reference sample S10. A sheet resistance of the sample S13 with both F doping and msec annealing lowers to about a half of the sheet resistance of the reference sample S10. It can be said that a high B concentration in the plateau and a broad depth range of the plateau both function effectively. It can also be said that the B concentration of $2.0E20 cm^{-3}$ or higher at the kink not obtainable heretofore has a symbolic meaning.

Figure 4:
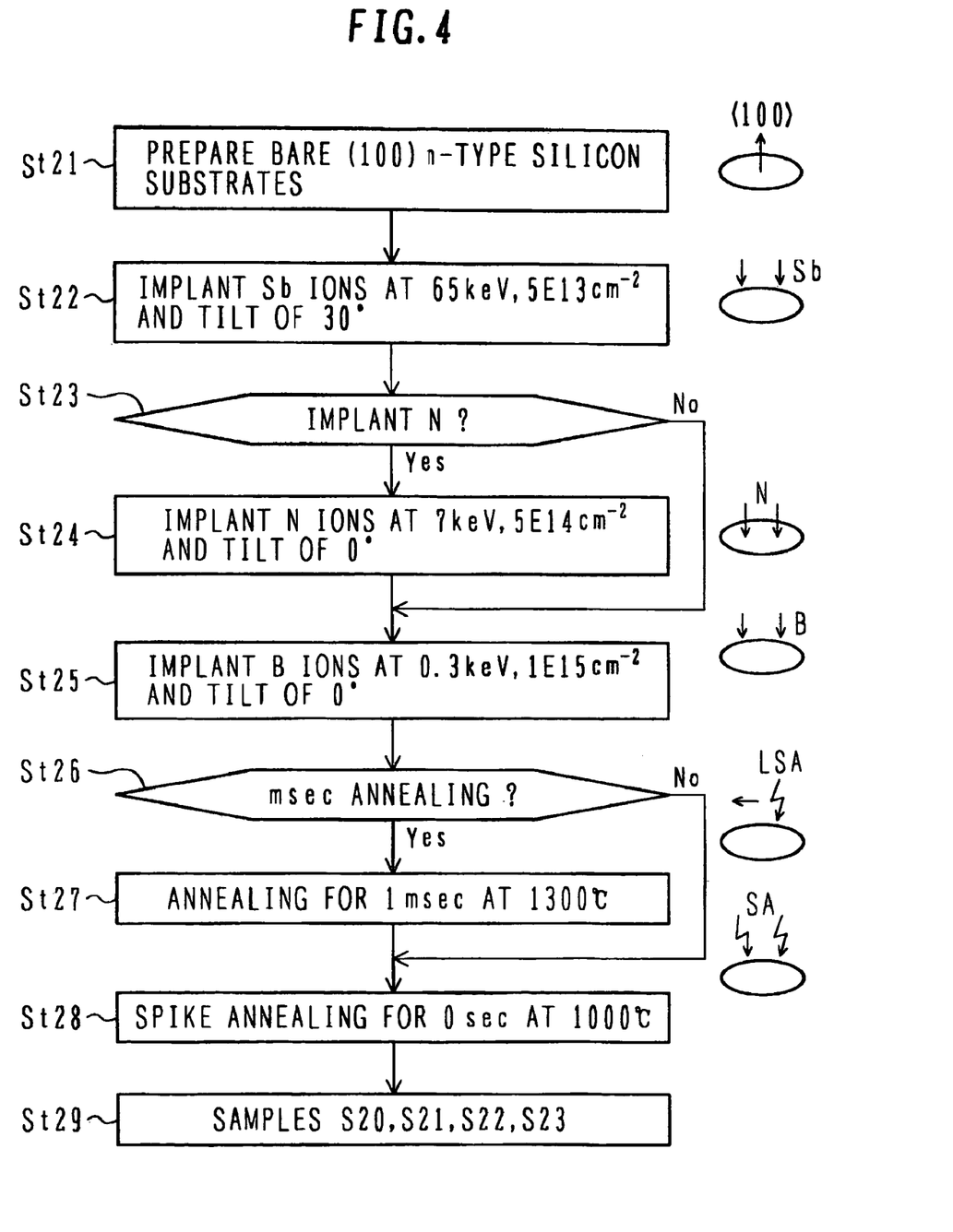
FIG. 4 is a flow chart illustrating the procedure of a second experiment.

FIG. 4 is a flow chart illustrating a second experiment. Steps St21 to St29 correspond to Steps St11 to St19 shown in FIG. 1. A different point resides in that nitrogen (N) ions are implanted at Step St24 instead of F ions. Step St23 groups the samples into samples with N implantation and samples without N implantation. A sample S20 without N implantation and msec annealing is the same as the sample S10 of the first experiment. A sample S21 with msec annealing is the same as the sample S11 of the first experiment. A sample with N implantation is a sample S22, and a sample with N implantation and msec annealing is a sample S23.

Figures 5A, 5B:
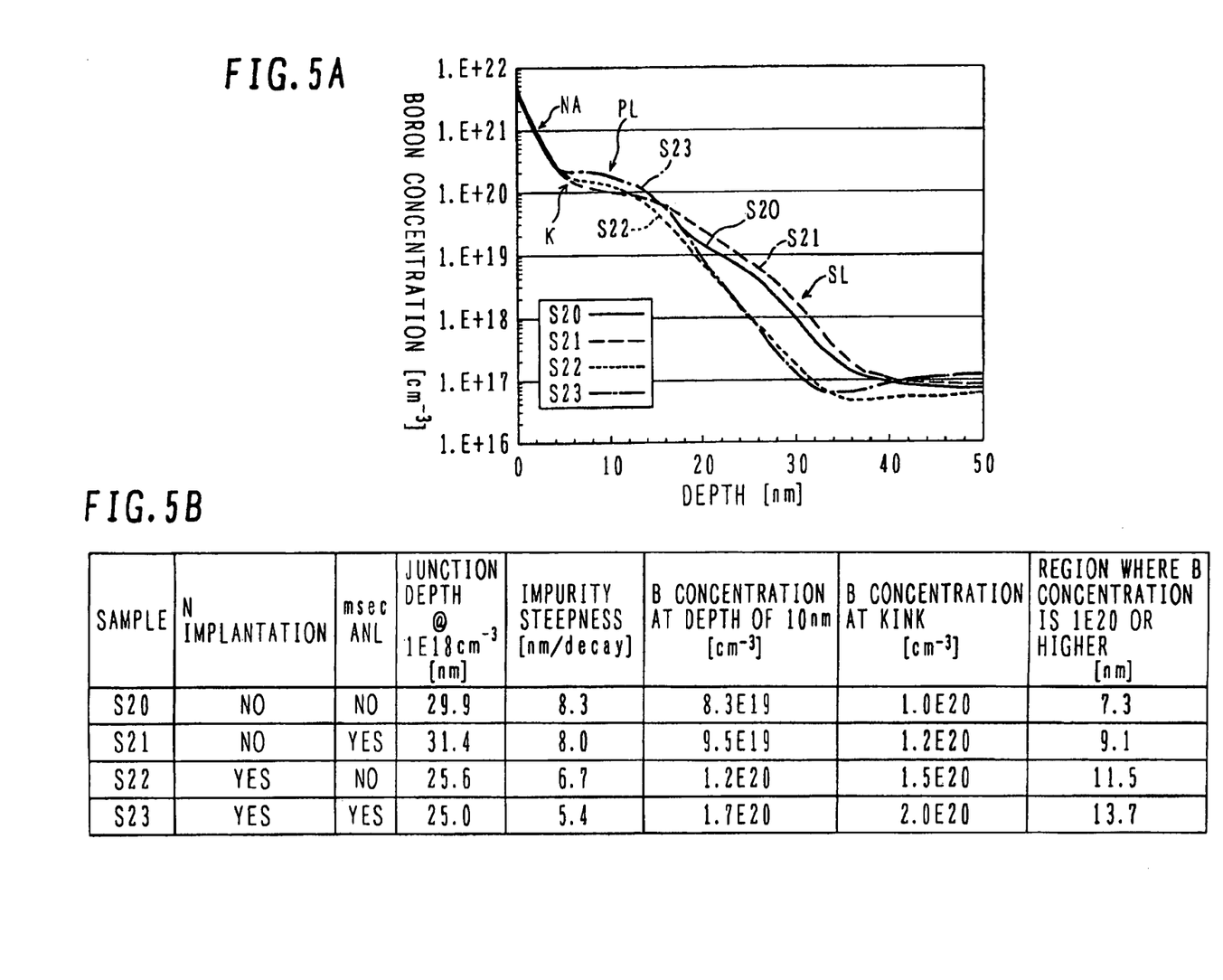
FIGS. 5A and 5B are a graph and a table showing B concentration profiles obtained by SIMS measurements of the second experiment.

Similar to the first experiment, a B concentration profile along a depth direction of four types of samples S20, S21, S22 and S23 were measured by SIMS.

FIG. 5A is a graph showing measurement results. The abscissa represents a depth from a substrate surface in the unit of nm, and the ordinate represents a boron (B) concentration in the unit of $cm^{-3}$. B concentrations of the sample S20 without N implantation and msec annealing and the sample S21 with only msec annealing have the same profiles as those of the samples S10 and S11 of the first experiment. The sample S20 indicates an non-active region NA steeply lowering a B concentration from the surface down to a depth of about 5 nm, a kink K pointing a transition from the non-active region NA to a plateau PL, the plateau PL gradually lowering a B concentration in the region from 5 to 15 nm in depth, and a sloped portion SL having a steeper B concentration decrease in the region deeper than the plateau.

A B concentration of the sample S21 with msec annealing slightly increases in the plateau PL and also in the succeeding sloped portion SL. It can be said that the junction depth becomes deep.

The sample S22 with N implantation has a profile that a B concentration is further increased in the first half of the plateau PL, then a reduction speed increases in the succeeding portion and the sloped portion SL is positioned very near to the surface. It can be said that the junction depth becomes shallow.

Although a B concentration of the sample S23 with N implantation and msec annealing has a profile similar to the B concentration profile of the sample S22, a concentration in the plateau increases further and maintains high in a range which is broad to some extent, and a steeper sloped portion SL is formed. A B concentration in the region deeper than about 22 nm is lower than that of the profile of the sample S22. Assuming that the junction plane is at a depth of 1E18 cm$^{-3}$, the junction depth is made shallower. Since the B concentration in the plateau is increased and maintained in a range which is broad to some extent, it is expected that the resistance is lowered.

FIG. 5B is a table formed by extracting characteristic features of the graph shown in FIG. 5A. The features of the B concentration profile are represented by: a junction depth at a concentration of 1E18 cm$^{-3}$; impurity steepness measured by a depth difference between a concentration 1E19 cm$^{-3}$ and a one-digit smaller concentration 1E18 cm$^{-3}$; a B concentration at a depth of 10 nm; a B concentration at the kink; and a depth of a region where a B concentration is 1E20 cm$^{-3}$ or higher.

Each feature value of the reference sample S20 and the sample S21 with only msec annealing is the same as each feature value of the samples S10 and S11 shown in FIG. 2B.

The sample S21 with only msec annealing has an increased B concentration at a depth of 10 nm, an increased B concentration at the kink, and a deeper depth of the region where the B concentration is 1E20 cm$^{-3}$ or higher. Therefore, the junction depth becomes deep.

The sample S22 with only N implantation has steepness of the impurity distribution of 6.7 nm/decay which is definitely steeper, and has clearly an increased B concentration of 1.2E20 cm$^{-3}$ at a depth of 10 nm, an increased B concentration of 1.5E20 cm$^{-3}$ at the kink, and a deeper depth of 11.5 nm of the region where the B concentration is 1E20 cm$^{-3}$ or higher. It is clear that the junction depth becomes shallow to 25.6 nm.

The sample S23 with both N implantation and msec annealing has a junction depth of 25.0 nm shallower than that of the sample S22 and impurity distribution steepness of 5.4 nm/decay steeper than that of the sample S22. A definite increase appears in a B concentration of 1.7E20 cm$^{-3}$ at the depth of 10 nm, a B concentration of 2.0E20 cm$^{-3}$ at the kink, and a depth of 13.7 nm of the region where the B concentration is 1E20 cm$^{-3}$ or higher. A high B concentration of 2.0E20 cm$^{-3}$ or higher not obtained heretofore is realized although it is lower than the B concentration of 2.4E20 cm$^{-3}$ at the kink of the sample S13 with F implantation and msec annealing. It is expected that the resistance lowers.

It has been found from the results of the first and second experiments that in forming a p-type region by implanting boron (B) ions into the n-type region with antimony (Sb) ions being implanted as a background, a shallow, low resistivity p-type region can be formed by further implanting F or N ions and performing msec annealing before spike annealing. It has also been found that F and N present excellent results, as ion implantation species for a combination of B, msec annealing and spike annealing. From the viewpoint of low resistance, F is possibly superior to N. From the viewpoint of shallow junction and a box-like B concentration profile, N is possibly superior to F.

Instead of implanting B and F ions separately, molecular ions containing B and F such as $BF_2$ may be implanted, with similar results being expected. If $BF_2$ is to be used as implantation ion species, an acceleration energy is set to 1.5 keV or smaller at a same dose of B. Instead of implanting B and N ions separately, compound ions containing B and N may be implanted, with a possibility of similar results. Similar results are expected also in the case wherein instead of Sb, ions of a different n-type element such as As and P are implanted deeply. B is an element which is likely to diffuse abnormally and deepen a junction depth. Irrespective of a background of the substrate, in order to implant B ions shallowly and at a high concentration, it can be considered that at least ones of F or N ions are implanted and msec annealing is performed before spike annealing to form a shallow, low resistivity p-type region.

FIGS. 6A to 6J are cross sectional views illustrating sequentially the processes of a CMOS transistor manufacture method according to the first embodiment based upon the first experiment results.

Figure 6A:
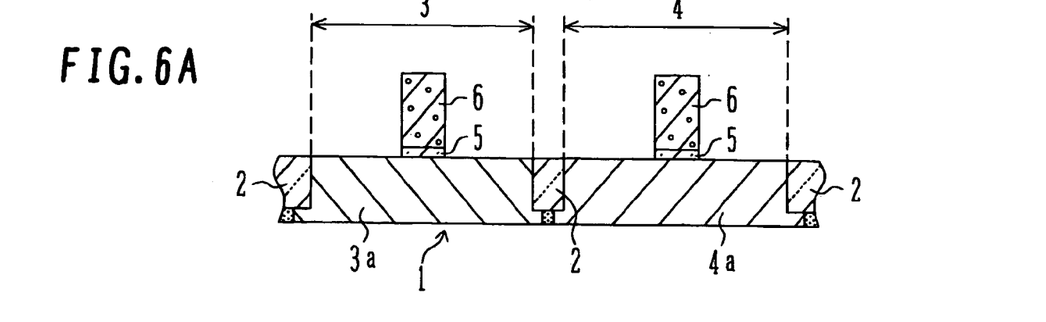
FIGS. 6A to 6J are schematic cross sectional views illustrating the processes of a CMOS semiconductor device manufacture method according to a first embodiment.

As shown in FIG. 6A, an isolation region 2 for defining active regions 3 and 4 is formed in a silicon substrate 1. For example, an oxide film and a nitride film are stacked on a silicon substrate, the oxide film and nitride film are patterned by using a resist pattern. By using a silicon nitride pattern as a mask, the silicon substrate is etched to form shallow trench isolation. If necessary, liners of an oxide film and a nitride film are formed on the trench surface. The trench is buried by an oxide film formed by high density plasma (HDP) chemical vapor deposition (CVD), and an unnecessary insulating film is removed by chemical mechanical polishing (CMP). In this manner, the isolation region 2 is formed by shallow trench isolation (STI). A p-well (n-channel region) 3a is formed by implanting p-type impurities in the active region 3, and an n-well (p-channel region) 4a is formed by implanting n-type impurities in the active region 4. The surfaces of the active regions 3 and 4 are thermally oxidized, and if necessary, nitrogen is introduced, to form a gate insulating film 5. A polysilicon film is deposited on the gate insulating film 5 and etched by using a resist mask to pattern a gate electrode 6.

Figure 6B:
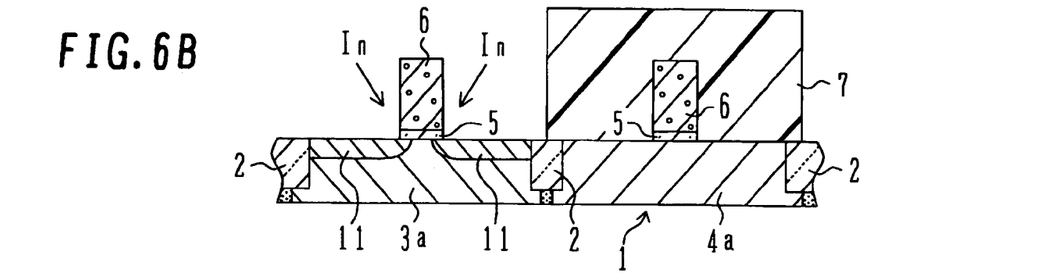

As shown in FIG. 6B, the p-channel active region 4 is covered with a resist mask 7. By using the gate electrode 6 as a mask, indium (In) ions of p-type impurities are implanted into the n-channel active region 3 exposed by the resist mask 7, on both sides of the gate electrode 6, along symmetrical four directions having a tilt angle of 0° to 45°, at an acceleration energy of 30 keV to 100 keV and a dose of 5E12 cm$^{-2}$ to 2E13 cm$^{-2}$, to thereby form p-type pocket regions 11. When a tilt angle is mentioned, it is assumed that ions are implanted along symmetrical four directions, similar to that described above. A dose is multiplied by four.

Figure 6C:
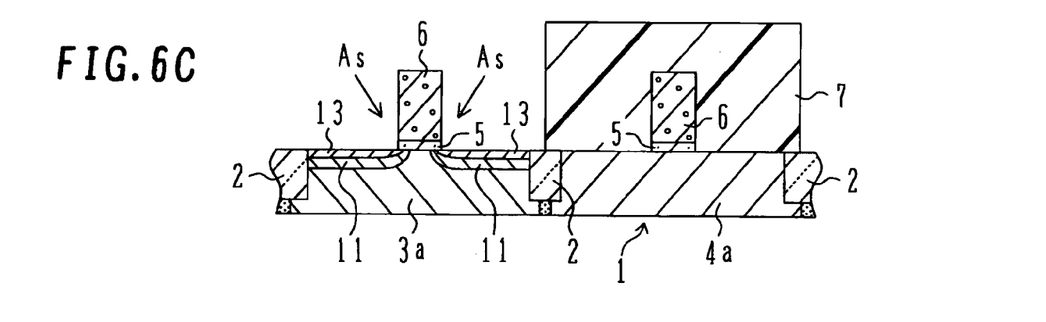

As shown in FIG. 6C, ion implantation is performed to form extension regions. Specifically, by using the gate electrode 6 as a mask, arsenic (As) ions of n-type impurities are implanted into the n-channel active region 3 exposed by the resist mask 7, on both sides of the gate electrode 6, to form extension regions 13. The As ion implantation conditions are an acceleration energy of 1 keV to 5 keV (or 0.5 keV to 10 keV), a dose of $1\times10^{14}$/cm$^2$ to $2\times10^{15}$/cm$^2$ and a tilt angle of 0° to 10° (or 0° to 30°). After the resist mask 7 is removed by ashing or the like, spike annealing is performed. Annealing is performed by RTA for almost 0 sec at 900° C. to 1050° C. in an inert atmosphere such as nitrogen. This annealing process is considered particularly to improve electrical activation of In ions implanted to form the pocket regions 11, and may be omitted depending upon adjustment of succeeding heat treatment and annealing.

Figure 6D:
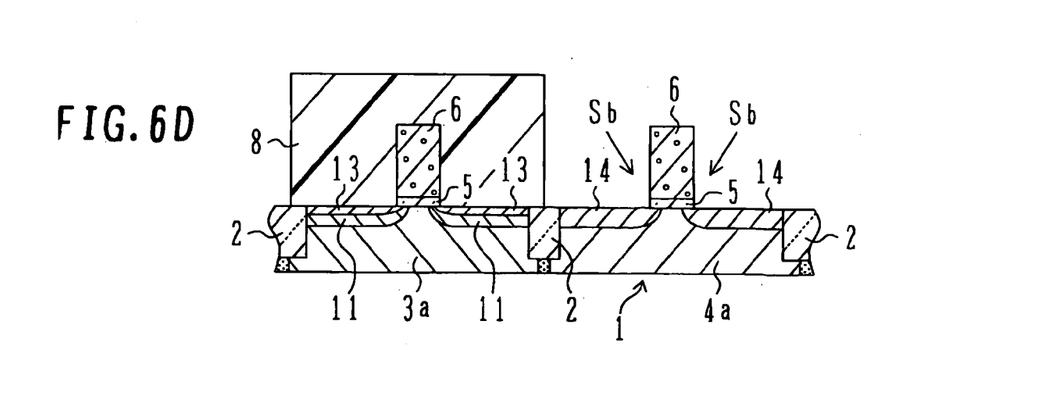

As shown in FIG. 6D, a resist mask 8 is formed covering the n-channel active region 3 and exposing the p-channel active region 4. Ion implantation is performed to form pocket regions. Specifically, by using the gate electrode 6 as a mask, antimony (Sb) ions of n-type impurities are implanted into the p-channel active region 4 exposed by the resist mask 8, on both sides of the gate electrode 6, to form pocket regions 14. The Sb ion implantation conditions are an acceleration energy of 30 keV to 100 keV, a dose of $5\times10^{12}/cm^2$ to $2\times10^{13}/cm^2$ and a tilt angle of 0° to 45°.

Figure 6E:
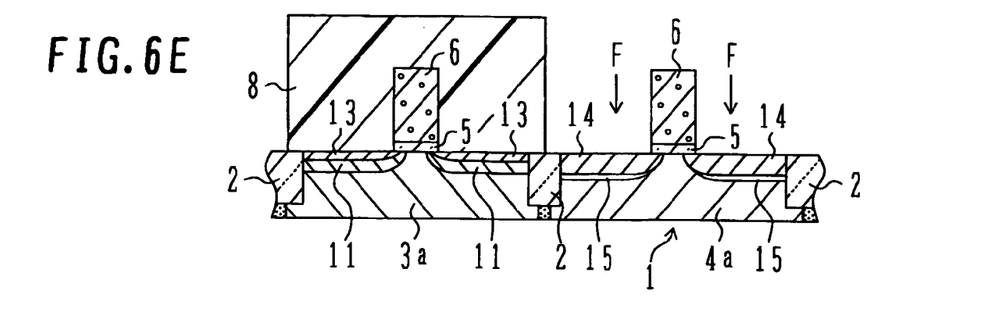

As shown in FIG. 6E, fluorine (F) ions are implanted into the p-channel active region 4. Specifically, by using the gate electrode 6 as a mask, F ions are implanted into the p-channel active region 4 exposed by the resist mask 8, on both sides of the gate electrode 6, to form F diffusion regions 15 approximately superposed upon extension regions 16 to be described later. The F ion implantation conditions are an acceleration energy of 1 keV to 10 keV, a dose of $1\times10^{14}/cm^2$ to $2\times10^{15}/cm^2$ and a tilt angle of 0° to 10°.

Figure 6F:
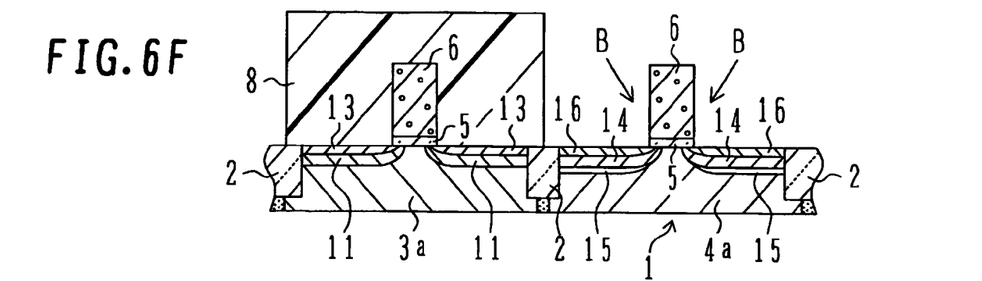

As shown in FIG. 6F, ion implantation is performed to form p-type extension regions. Specifically, by using the gate electrode 6 as a mask, boron (B) ions of p-type impurities are implanted into the p-channel active region 4 exposed by the resist mask 8, on both sides of the gate electrode 6, to form the extension regions 16. The B ion implantation conditions are an acceleration energy of 0.5 keV or smaller (or 1 keV or smaller), a dose of $1\times10^{14}/cm^2$ to $2\times10^{15}/cm^2$ and a tilt angle of 0° to 10° (or 0° to 30°). The resist mask is thereafter removed.

Figure 6G:
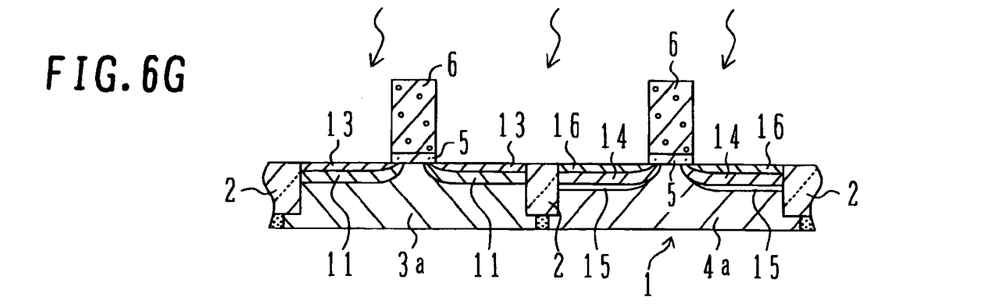

As shown in FIG. 6G, msec annealing is performed in an $N_2$ atmosphere. The msec annealing is performed at a heating temperature of 1100° C. or higher and 1400° C. or lower and a heating time of 0.01 msec or longer and 100 msec or shorter. The heating time is preferably 0.1 msec or longer and 10 msec or shorter. In this example, the heating temperature was set to 1300° C. and the heating time was set to 1 msec. The msec annealing was performed by using LSA100 manufactured by Ultratech Inc. or LA-3000-F manufactured by DAINIPPON SCREEN MFG. CO. LTD.

It can be considered that msec annealing can activate impurities at a high activation rate or factor not obtained by rapid thermal annealing (RTA), while rarely diffusing the impurities and can restore crystal defects formed during ion implantation.

Figure 6H:
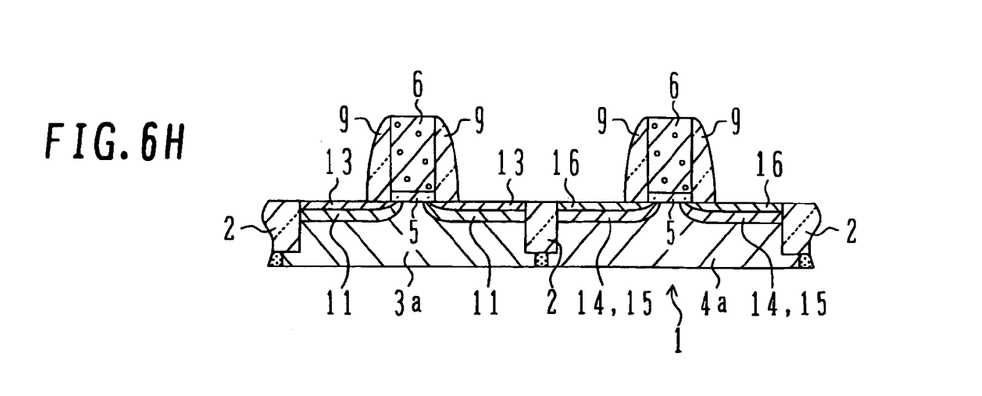

As shown in FIG. 6H, a silicon oxide film is deposited on the whole substrate surface by CVD or the like, and anisotropically etched (etched back) to leave the silicon oxide film only on the sidewalls of each gate electrode 6 and form sidewall spacers 9.

Figure 6I:
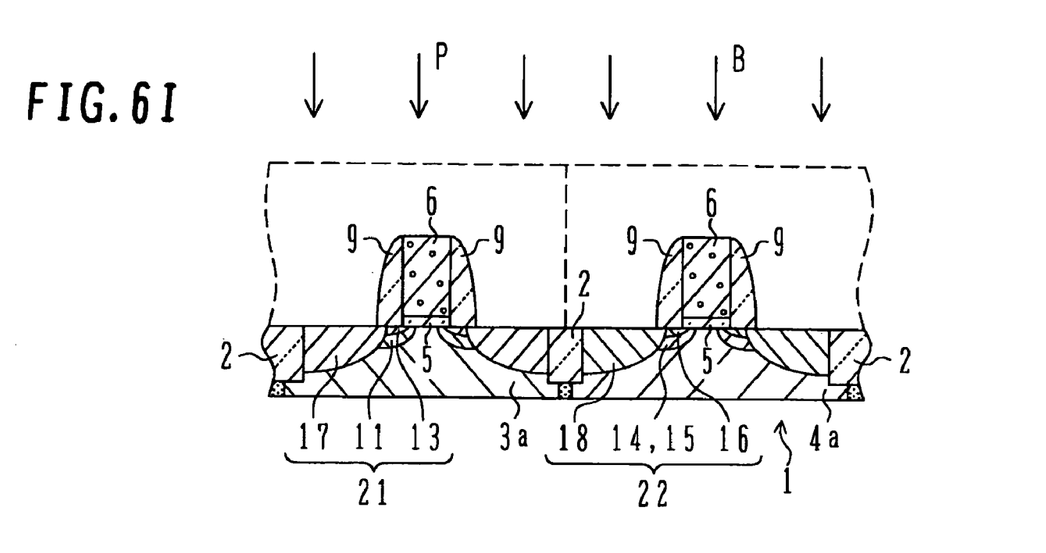

As shown in FIG. 6I, deep source/drain regions (deep S/D regions) are formed in the active regions 3 and 4 by using resist masks. Specifically, a resist mask exposing only the n-channel active region 3 is formed, and by using this resist mask, gate electrode 6 and sidewall spacers 9 as a mask, phosphorus (P) ions of n-type impurities are implanted into the n-channel active region 3, on both sides of the gate electrode 6, to form the deep S/D regions 17. The P ion implantation conditions are an acceleration energy of 5 keV to 20 keV (or 1 keV to 20 keV), a dose of $2\times10^{15}/cm^2$ to $1\times10^{16}/cm^2$ (or $2\times10^{15}/cm^2$ to $2\times10^{16}/cm^2$) and a tilt angle of 0° to 10° (or 0° to 30°). The resist mask is thereafter removed.

Next, a resist mask exposing only the p-channel active region 4 is formed, and by using this resist mask, gate electrode 6 and sidewall spacers 9 as a mask, boron (B) ions of p-type impurities are implanted into the p-channel active region 4 exposed by the resist mask, on both sides of the gate electrode 6, to form deep S/D regions 18. The B ion implantation conditions are an acceleration energy of 2 keV to 5 keV, a dose of $2\times10^{15}/cm^2$ to $1\times10^{16}/cm^2$ and a tilt angle of 0° to 10°. The resist mask is thereafter removed.

Figure 6J:
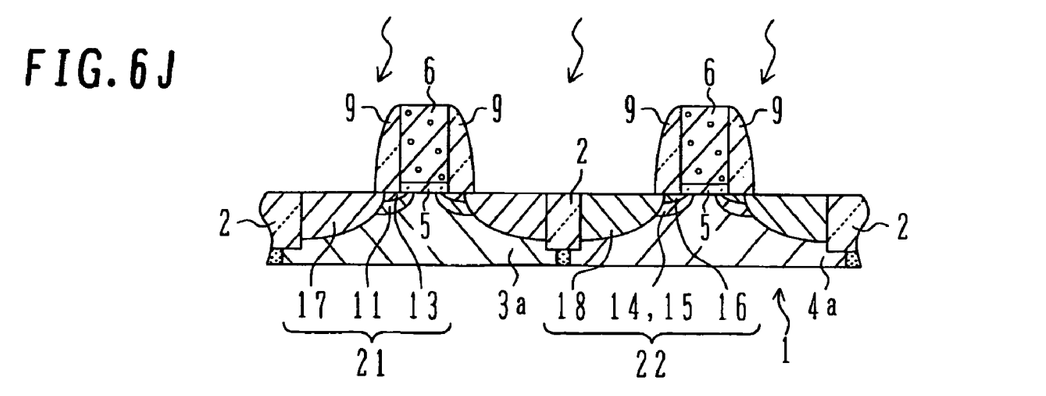

As shown in FIG. 6J, impurities are activated by performing spike annealing (RTA) for almost 0 sec at 1000° C. to 1050° C. (or for 10 sec or shorter at 900° C. to 1100° C.). It is therefore possible to form an n-type impurity diffusion layer 21 constituted of the pocket regions 11, extension regions 13 and deep S/D regions 17, respectively disposed in the n-channel active region 3, and a p-type impurity diffusion layer 22 constituted of the pocket regions 14, F diffusion regions 15, extension regions 16 and deep S/D regions 18, respectively disposed in the p-channel active region 4.

A CMOS semiconductor device is completed after forming interlayer insulating films, contact holes, various wirings and the like. The processes of forming these elements may use various well-known technologies.

Similar to the first experiment, p-channel MOS transistors of the embodiment and various comparative p-channel MOS transistors were formed and their characteristic features were measured. LSA100 manufactured by Ultratech Inc. was used as a msec annealing system. Measured values were minimum gate lengths capable of ensuring threshold values and corresponding maximum drain currents.

Figure 7:
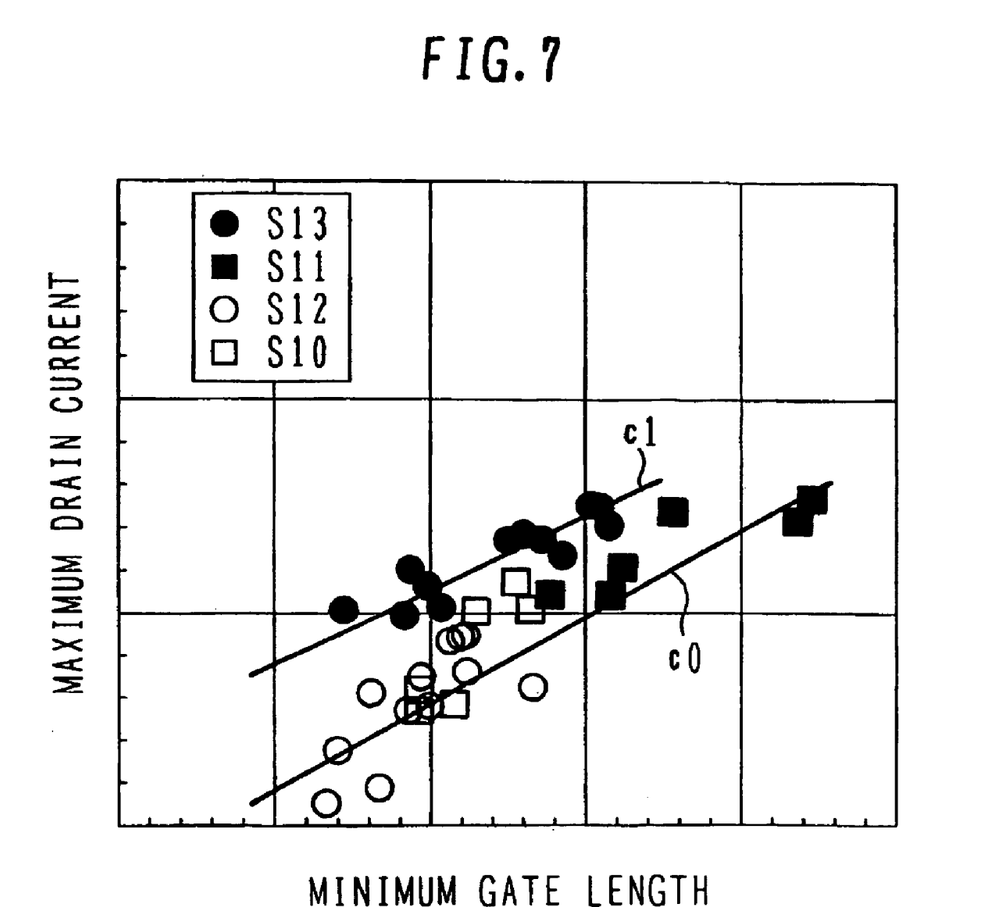
FIG. 7 is a graph showing the transistor characteristics of samples manufactured by the method of the first embodiment and comparative samples.

FIG. 7 is a graph showing measured characteristic features of the transistors. Similar to the first experiment, a sample without both F doping and msec annealing is represented by S10, a sample with only msec annealing is represented by S11, a sample with only F doping is represented by S12, and a sample (of the embodiment) with F doping and msec annealing is represented by S13. The features of the samples S10, S11 and S12 are considered to be plotted on one characteristic line c0. The feature c1 of the samples S13 of the embodiment clearly shows large maximum drain currents as compared to the characteristic line c0. This may be ascribed to that as the resistance in the extension regions lowers, a large drain current is allowed to be flowed. Similar results were also obtained by using LA-3000-F manufactured by DAINIPPON SCREEN MFG. CO. LTD for msec annealing.

In this embodiment, in forming the source/drain extension regions of a p-channel transistor, ion implantation for forming the pocket regions, F implantation and ion implantation for forming the extension regions are performed in this order. This order may be changed. However, depending upon the order, concentration profiles of the pocket regions or extension regions immediately after ion implantation may be influenced by the amorphousization effects.

In the manufacture of a semiconductor device having a B doped region, it can be considered that excellent transistor characteristics can be obtained by doping F or N further into the region where B ions are implanted, and performing msec annealing and spike annealing (RTA). In this semiconductor device, the B doped p-type region contains F or N. A B concentration of $2\times10^{20}$ $cm^{-3}$ or higher at the kink from which the plateau starts, measured by SIMS along the depth direction, is a value not realized heretofore and only realized by the technologies of the present invention.

Pocket regions of an n-channel transistor are made of p-type regions. This p-type pocket regions can be formed by B doping, msec annealing and RTA spike annealing.

FIGS. 8A to 8H are schematic cross sectional views illustrating sequentially the processes of a CMOS transistor manufacture method according to the second embodiment.

Figure 8A:
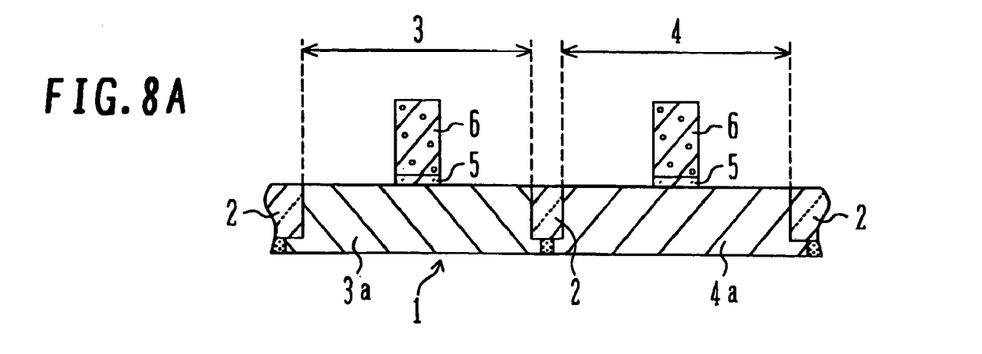
FIGS. 8A to 8H are schematic cross sectional views illustrating the processes of a CMOS semiconductor device manufacture method according to a second embodiment.

As shown in FIG. 8A, active regions and gate electrodes are formed by processes similar to those described with FIG. 6A.

Figure 8B:
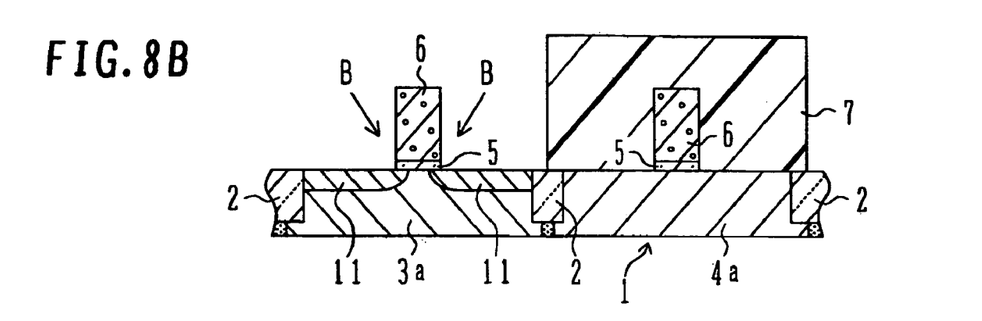

As shown in FIG. 8B, a resist mask 7 is formed covering the p-channel active region 4 and exposing the n-channel active region 3. First, ion implantation is performed to form pocket regions in the n-channel active region 3. Specifically, by using the gate electrode 6 as a mask, boron (B) ions of p-type impurities are implanted into the n-channel active region 3 exposed by the resist mask 7, on both sides of the gate electrode 6, to form pocket regions 11. The B ion implantation conditions are an acceleration energy of 3 keV to 10 keV, a dose of $5\times10^{12}/cm^{12}$ to $2\times10^{13}/cm^2$, and symmetrical four directions having a tilt angle of 0° to 45° relative to a normal direction of 0° to the semiconductor substrate 1.

Figure 8C:
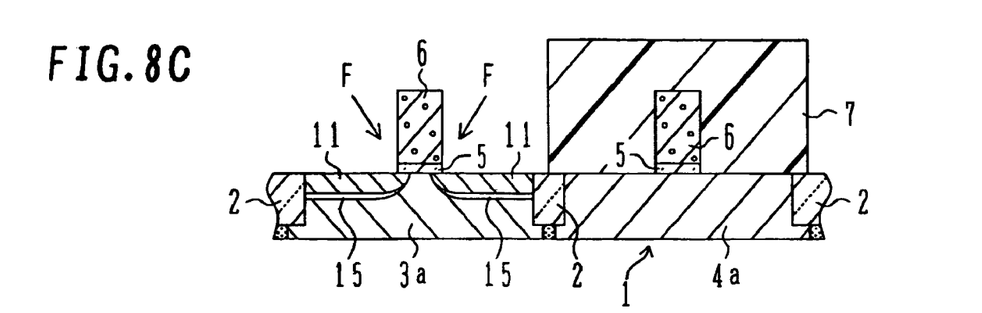

As shown in FIG. 8C, by using the gate electrode 6 as a mask, fluorine (F) ions are implanted into the n-channel active region 3 on both sides of the gate electrode 6, to form F diffusion regions 15 approximately superposed on the B ion implanted pocket regions 11. The F ion implantation conditions are an acceleration energy of 1 keV to 10 keV, a dose of $1\times10^{13}/cm^2$ to $2\times10^{15}/cm^2$ and a tilt angle of 0° to 45° which is the same as the tilt angle for B ion implantation. In place of implanting B and F separately, molecular ions containing B and F ($BF_2^+$ ions and/or $BF^+$ ions etc.) may be implanted, and similar effects can be expected. In case of using $BF_2^+$ as implanting ion species, accelerating energy of 15 keV to 50 keV, and dose of the same amount may be adapted. In case of using $BF^+$ as implanting ion species, accelerating energy of 8 keV to 30 keV, and dose of the same amount may be adapted.

Figure 8D:
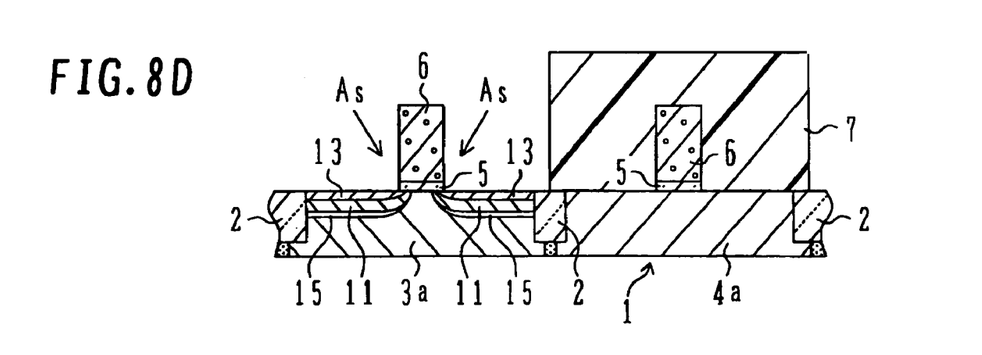

As shown in FIG. 8D, ion implantation is performed to form extension regions. Specifically, by using the gate electrode 6 as a mask, arsenic (As) ions of n-type impurities are implanted into the n-channel active region 3 exposed by the resist mask 7, on both sides of the gate electrode 6, to form extension regions 13. The As ion implantation conditions are an acceleration energy of 1 keV to 5 keV (or 0.5 keV to 10 keV), a dose of $1\times10^{14}/cm^2$ to $1\times10^{15}/cm^2$ and a tilt angle of 0° to 10° (or 0° to 30°). The resist mask is thereafter removed.

Figure 8E:
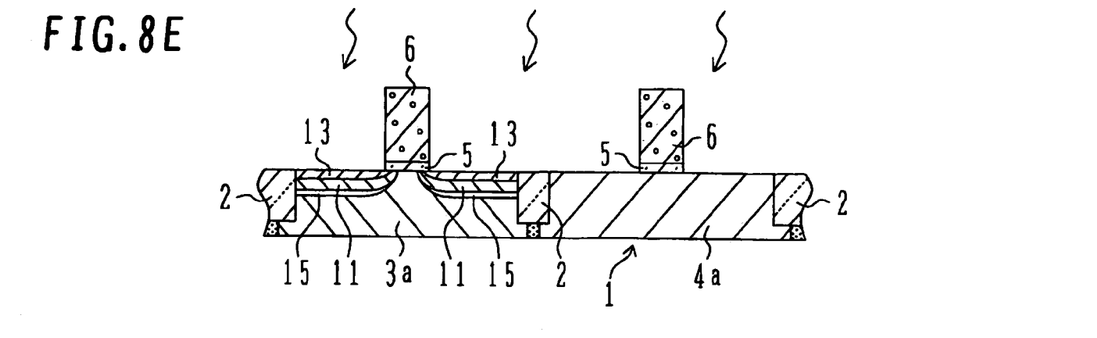

As shown in FIG. 8E, msec annealing is performed in an $N_2$ atmosphere. The msec annealing is performed at a heating temperature of 1100° C. or higher and 1400° C. or lower with a heating time of 0.01 msec or longer and 100 msec or shorter. The heating time is preferably 0.1 msec or longer and 10 msec or shorter. In this example, the heating temperature was set to 1300° C. and the heating time was set to 1 msec. The msec annealing was performed by using LSA100 manufactured by Ultratech Inc. or LA-3000-F manufactured by DAINIPPON SCREEN MFG. CO. LTD.

It can be considered that msec annealing can activate impurities at a high activation factor not obtained by rapid thermal annealing (RTA), while rarely diffusing the impurities and can restore crystal defects formed during ion implantation.

Figure 8F:
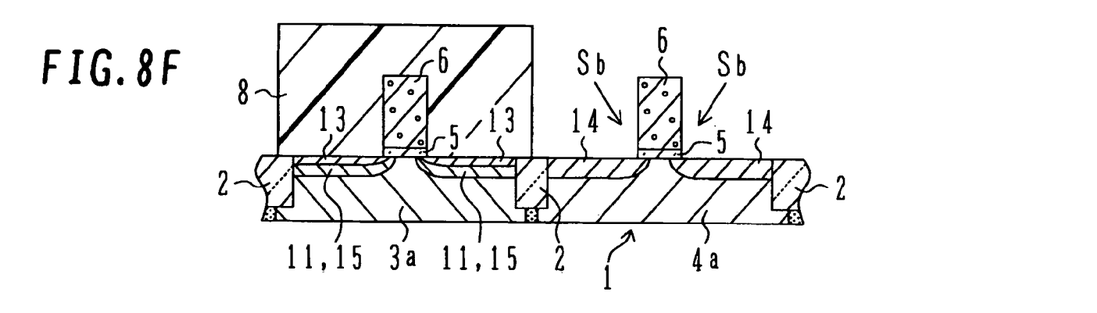

As shown in FIG. 8F, a resist mask 8 is formed covering the n-channel active region 3 and exposing the p-channel active region 4. Ion implantation is performed to form pocket regions. Specifically, by using the gate electrode 6 as a mask, antimony (Sb) ions of n-type impurities are implanted into the p-channel active region 4 exposed by the resist mask 8, on both sides of the gate electrode 6, to form pocket regions 14. The Sb ion implantation conditions are an acceleration energy of 30 keV to 100 keV, a dose of $5\times10^{12}/cm^2$ to $2\times10^{13}/cm^2$ and a tilt angle of 0° to 45°.

Figure 8G:
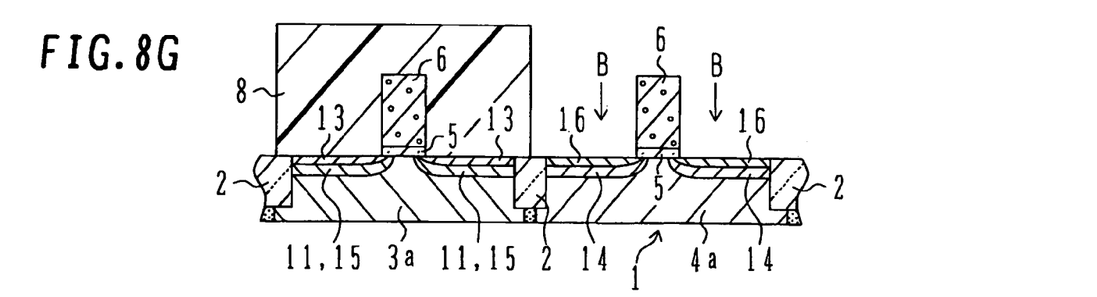

As shown in FIG. 8G, ion implantation is performed to form extension regions. Specifically, by using the gate electrode 6 as a mask, boron (B) ions of p-type impurities are implanted into the p-channel active region 4 exposed by the resist mask 8, on both sides of the gate electrode 6, to form extension regions 16. The B ion implantation conditions are an acceleration energy of 0.5 keV or smaller (or 1 keV or smaller), a dose of $1\times10^{14}/cm^2$ to $2\times10^{15}/cm^2$ and a tilt angle of 0° to 10° (or 0° to 30°). The resist mask is removed thereafter.

Thereafter, those steps for forming sidewall spacers, deep S/D forming ion implantation, RTA annealing for activation, similar to those illustrated in FIGS. 6H to 6K are performed. Then, multi-layer wiring may be formed as desired.

Figure 8H:
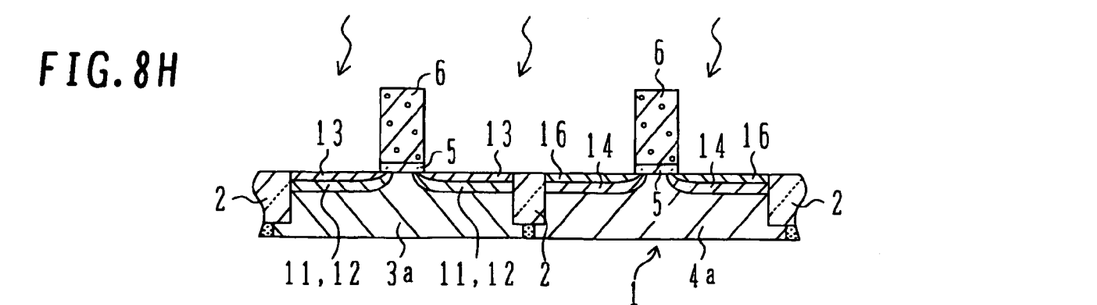

As shown in FIG. 8H, in an alternative example, RTA annealing may also be performed for the active regions 3 and 4, before forming sidewall spacers. The annealing conditions may be a heating temperature of 900° C. to 1050° C., a heating time of approximately 0 sec, and a nitrogen atmosphere.

Similar to the first embodiment, n-channel transistors of the embodiment and various comparative transistors were formed and their characteristic features were measured. The msec annealing was performed by using LA-3000-F manufactured by DAINIPPON SCREEN MFG. CO. LTD.

Figure 9:
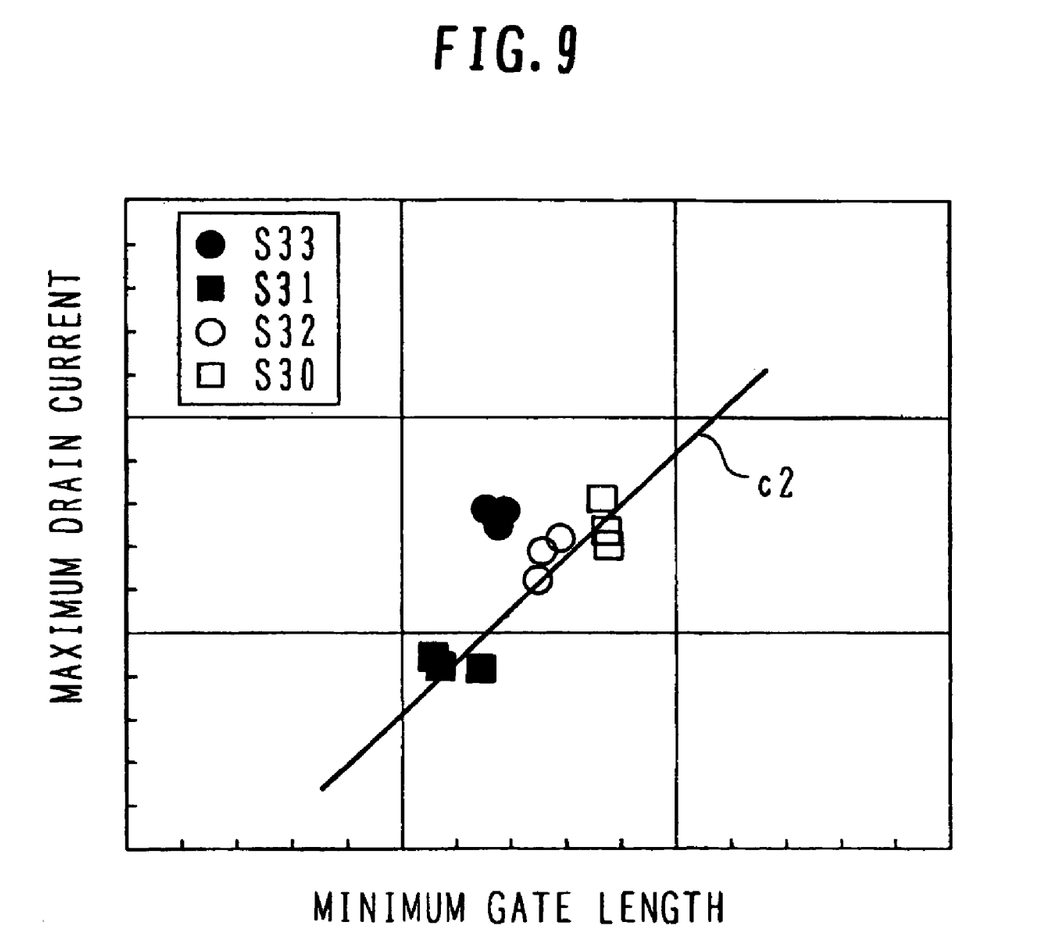
FIG. 9 is a graph showing the transistor characteristics of samples manufactured by the method of the second embodiment and comparative samples.

FIG. 9 is a graph showing measured characteristics of the transistors. The abscissa represents a minimum gate length, and the ordinate represents a maximum drain current. A sample S33 of an n-channel transistor of the embodiment is formed by implanting F ions superposed upon the pocket regions where B ions are doped, performing msec annealing and then RTA annealing. A sample S30 is formed by fundamental processes without F doping and msec annealing. A sample S31 is formed by adding only msec annealing, and a sample S32 is formed by adding only F doping.

The measurement values of the samples S30, S31 and S32 are considered to be plotted on one characteristic line c2. A measurement value of the sample S33 of the embodiment has clearly a higher drain current than that of the characteristic line c2.

The present invention has been described in connection with the preferred embodiments. The invention is not limited only to the above embodiments. RTA spike annealing may be replaced with another annealing with a heating time longer than the msec annealing, which can restore the crystallinity of the damaged layer. Various structures described in JP-A-2004-235603, which is incorporated herein by reference, can be adopted. Other elements of n- and p-type impurities may also be used. It will be apparent to those skilled in the art that other various modifications, substitutions, improvements, combinations, and the like can be made.

What we claim are:

1. A method for manufacturing a semiconductor device, comprising the steps of:
   (x) forming an insulated gate electrode on an n-type active region in a semiconductor
   (a) implanting boron (B) ions into said n-type active region, using said insulated gate electrode as a mask;
   (b) implanting fluorine (F) or nitrogen (N) ions into said n-type active region, using said insulated gate electrode as a mask;
   (c) after said steps (x), (a) and (b) are performed, executing first annealing with a heating time of 100 msec or shorter relative to a region of said semiconductor substrate into which ions were implanted; and
   (d) after said step (c) is performed, executing second annealing with a heating time longer than the heating time of said first annealing, relative to the region of said semiconductor substrate into which ions were implanted, wherein said step (d) is carried out after said step (c) without an intervening ion implantation process.

2. The method for manufacturing a semiconductor device according to claim 1, wherein:
said step (a) forms p-type extension regions of source/drain regions of a p-channel transistor in said n-type active region on both sides of said insulated gate electrode.

3. The method for manufacturing a semiconductor device according to claim 2, further comprising the step of:
(f) after said step (x), implanting n-type impurity ions into said n-type active region deeper than said extension regions to form n-type pocket regions.

4. The method for manufacturing a semiconductor device according to claim 3, wherein: said step (f) is performed at an oblique incident angle.

5. The method for manufacturing a semiconductor device according to claim 1, wherein:
said semiconductor substrate includes a p-type active region;
said step (x) also forms said insulated gate electrode on said p-type active region; and
said step (a) forms p-type pocket regions of an n-channel transistor in said p-type active region on both sides of said insulated gate structure.

6. The method for manufacturing a semiconductor device according to claim 1, wherein said steps (a) and (b) are executed at a same time by implanting BF or $BF_2$ ions.

7. The method for manufacturing a semiconductor device according to claim 1, wherein: the region implanted with boron by said step (a) has such a boron concentration profile after said step (d), that has a non-active region from a surface of said semiconductor substrate to a first depth, a plateau region from the first depth to a second depth, and a sloped portion from the second depth, and the boron concentration at the first depth is at least $2 \times 10^{20}$ $cm^{-3}$.

* * * * *